United States Patent
Yin et al.

(10) Patent No.: US 6,525,818 B1
(45) Date of Patent: Feb. 25, 2003

(54) OVERLAY ALIGNMENT SYSTEM USING POLARIZATION SCHEMES

(75) Inventors: Xiaoming Yin, Hopewell Junction, NY (US); Tim Wiltshire, Fishkill, NY (US); Alfred Wong, Beacon, NY (US); Don Wheeler, Beacon, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/500,110

(22) Filed: Feb. 8, 2000

(51) Int. Cl.[7] ............................................. G01B 11/00
(52) U.S. Cl. ...................................... 356/400; 356/369
(58) Field of Search ................................ 356/399, 400, 356/401, 369; 430/22, 30

(56) References Cited

U.S. PATENT DOCUMENTS

| | | | |
|---|---|---|---|
| 5,285,258 A | 2/1994 | Kamon | 356/375 |
| 5,459,000 A * | 10/1995 | Unno | 430/5 |
| 5,477,057 A | 12/1995 | Angeley et al. | 250/548 |
| 5,933,219 A * | 8/1999 | Unno | 355/71 |

* cited by examiner

Primary Examiner—Frank G. Font
Assistant Examiner—Layla Lauchman
(74) Attorney, Agent, or Firm—Stanton Braden

(57) ABSTRACT

An optical alignment system used in the manufacture of semiconductor integrated circuits determines and adjusts the alignment between features which have been formed on a semiconductor wafer and features on a mask which is being projected onto the semiconductor wafer. Light which illuminates the semiconductor wafer is scattered and diffracted into a dark-field detector system. This results in the generation of electrical signals which are used to position the mask relative to the semiconductor wafer. The use of polarized light in the present system results in an increase in the magnitude of the desired signals and a decrease in the magnitude of the spurious signals. To improve the quality of the signals, the angle of polarization of the light is adjusted to a specific relationship with respect to the geometry of the alignment marks on the semiconductor wafer.

13 Claims, 10 Drawing Sheets

LASER BEAM ILLUMINATION POSITION

OVERLAY ALIGNMENT SYSTEM USING POLARIZATION SCHEMES

FIELD OF THE INVENTION

The field of this invention relates to semiconductor manufacturing, and more particularly, to photolithography and to the use of alignment systems in photolithography, and to the use of polarized light in alignment systems.

BACKGROUND OF THE INVENTION

In fabricating microelectronic semiconductor devices and the like on a semiconductor wafer (body, substrate, or chip) to form an integrated circuit (IC) various metal layers and insulation layers are deposited in selective sequence, various openings are formed in these layers, various impurities may be deposited within these openings, and in some cases oxide layers are grown in situ on the wafer. The features formed on the various layers must be aligned with respect to, or placed in the proper spatial relation to, features which have been formed on the semiconductor wafer at an earlier step in the process sequence. To maximize integration of device components in the available wafer area to fit more components in the same area, increased IC miniaturization is utilized. Reduced dimensions of the features formed on the semiconductor wafer are needed for denser packing of components to meet the requirements of present day very large scale integration (VLSI). As the lateral size of the features is reduced, the thickness of the various layers is similarly decreased. The size of features formed on the semiconductor wafer are typically in the range of 100 nm or smaller. As the dimensions of these features are reduced, the features must be aligned with respect to one another to a greater and greater degree of precision.

The transfer of patterns from masks (reticles) to the semiconductor wafer is typically accomplished by projecting an image on the mask onto a layer of photoresist which has been deposited on the semiconductor wafer. The system used to accomplish this pattern transfer also typically includes apparatus to assure the correct alignment of the newly projected pattern with respect to the features previously formed on the semiconductor wafer.

One such system used to accomplish such pattern transfer and alignment is disclosed in U.S. Pat. No. 5,477,057 (David Angeley et al.), hereinafter "Angeley", which is entitled "Off Axis Alignment System for Scanning Photolithography", and is incorporated herein by reference. FIGS. 1, 2, 3, 4, 5, and 6 of this application are reproductions of FIGS. 1, 2, 3, 4, 5, and 7, respectively, of Angeley et al. The system of FIG. 1 contains an alignment system 12 that is mounted adjacent to a projection optical system used to project a mask pattern onto a photoresist layer 6 on a semiconductor wafer 18. The alignment system 12, which is shown in FIG. 2, uses a broadband light source 68 to illuminate two sets of alignment marks 34 and 34' on the semiconductor wafer 18. The light from source 68 illuminates a diffusing glass 76, which provides illumination of an alignment reticle 3 having a predetermined pattern 31, 33 formed thereon which is shown in FIG. 3. An optical system 10 images the alignment reticle pattern 31, 33 into the plane of the semiconductor wafer 18. The imaged light is reflected, scattered and diffracted by the alignment marks 34, 34' on the semiconductor wafer 18 as the wafer is scanned past the stationery alignment reticle image 96 shown in FIG. 4. The reflected, scattered and diffracted light is collected by optics 48 and 50 (see FIG. 2) and directed to the beam splitter 42. Beam splitter 42 deflects the light to the optical detector sub-system 24, where it is incident upon a detector mask 54. The optical detector sub-system 24 consists of detectors 58, 60, 62, 64, and 66 which detect light passing through openings in the detector mask 54 and guided to the detectors by fiber optics 30. FIG. 5 shows a plan view of the detector mask 54 with openings (transmission regions) 58', 60', 62', 64', and 66', corresponding to the five detectors 58, 60, 62, 64, and 66, respectively. Transmission region 58', which is a central region, collects light reflected from the semiconductor wafer 18 and the alignment marks 34 and 34'. This is "bright-field" detection. The other regions 60', 62', 64', and 66' collect light scattered or diffracted from the alignment marks 34 and 34' (i.e., "dark-field" detection) and are located around the central region 58' in the orientation shown in FIG. 5. These four other regions 60', 62', 64', and 66' further distinguish between the light scattered to the left and right of the central detector opening 58'.

The alignment marks used in this system (See FIG. 4) are features formed on the semiconductor wafer which are typically rectangular in nature, one set of such marks being arranged in a linear array, with the major axis of the rectangular alignment mark at a 45 degree angle to the axis of the linear array, and a second set of such marks, whose major axis is perpendicular to that of the first set, is arranged in a similar linear array. The alignment reticle 32 typically has two orthogonal intersecting rectangular apertures 31, 33 therein. The alignment reticle 32 is oriented such that light passing through one such rectangular aperture 31 illuminates the rectangular alignment marks 34 of one set of such marks, and light passing through a second rectangular aperture 33 illuminates the rectangular alignment marks 34' of the second set of such marks. The image 96 (see FIG. 6) of the alignment reticle 32 is scanned across the linear arrays of alignment marks 34 and 34' in a direction which is at an angle of 45 degrees with respect to the major axis of the arrays of alignment marks 34 and 34'.

In this system (FIG. 1) a mask pattern is transferred through the projection optical system 14 to the photoresist layer 6 on the semiconductor wafer 18 using highly coherent deep ultra violet (DUV) light for which the projection optical system and photoresist properties have been optimized. The alignment portion of the system uses a broadband light source in a wavelength band where the photoresist is not sensitive, and uses an optical system which is optimized to the requirements of the alignment system. This alignment system uses non-polarized light to illuminate the patterns of alignment marks.

As the size of the features formed on the semiconductor wafer decreases, the dimensions of the alignment marks formed on the semiconductor wafer are decreased so as to allow an improvement in the ability to align the various features formed on the semiconductor wafer with one another. As the width of the rectangular alignment marks is decreased, and as the thickness of these features, and the thickness of the layers in which these features are formed, decrease, the magnitude of the light scattered and diffracted from the features is decreased also.

Another such system used to accomplish pattern transfer and alignment is disclosed in U.S. Pat. No. 5,285,258 (K. Kamon), hereinafter "Kamon", which is entitled "Method of and an Apparatus for Detecting Alignment Marks", and is incorporated herein by reference. FIGS. 7, 8, 9, 10, and 11 are reproductions of FIGS. 4, 5, 9A, 7A, and 7B, respectively, of Kamon. This apparatus uses the same method as U.S. Pat. No. 5,477,057 of illuminating a pattern of alignment marks with a light beam while moving the semiconductor wafer relative to the light beam. This system differs from that of the system of U.S. Pat. No. 5,477,057 in that it makes use of a single detector to detect the light reflected from the alignment mark (i.e., "bright-field" detection), as opposed to the method of detecting the light scattered from the alignment marks which is known as "dark-field" detection. A general problem with this type of bright-field detection system is that the system readily detects not only light reflected from the surface of the alignment mark, but also detects light reflected from the surface of films which may cover the sides of the alignment mark. This is graphically illustrated in FIGS. 7 and 8. FIG. 7 graphically shows on the y-axis the Signal Intensity of light reflected from an idealized symmetric alignment mark 6, as a function of Laser Beam Illumination Position on the x-axis. The graph shows a single peak P of reflected light intensity as the light beam is traversed over the alignment mark. FIG. 8 graphically shows on the y-axis the Signal Intensity of light reflected from an alignment mark 6 which has been covered asymmetrically with a dielectric film 7, as a function of Laser Beam Illumination Position on the x-axis. Three peaks of light P1, P2, and P3 are detected as the light beam is traversed over the alignment mark 6, a central peak P2 from light reflected from the alignment mark itself, and the strong, undesired, subsidiary peaks P1 and P3 of light reflected from the surface of the overlying film. The subsidiary peaks P1 and P3 make it difficult to detect the precise position of the alignment mark.

U.S. Pat. No. 5,285,258 (K. Kamon) teaches the use of a polarized light beam, as opposed to the non-polarized light beam which had been used in U.S. Pat. No. 5,477,057 discussed herein above. The use of the polarized light beam results in a reduction of the amplitude of the undesired subsidiary peaks. The geometry of this arrangement is depicted in FIG. 9, where the light beam 10 is polarized such that the electric field of the light is in the direction y, a direction perpendicular to the major dimension x, of the linear array of alignment marks 6, and thus parallel to the direction y in which the light beam is scanned along the array of alignment marks. FIG. 10 shows the polarized light beam in relation to one alignment mark 6, the surface 8 of the film 7 overlying the alignment marks, and the scanning motion of the light beam in the y-direction across the alignment mark 6. FIG. 11 graphically shows on the y-axis the Signal Intensity of light reflected from the alignment mark 6 and overlying film 7, as a function of Laser Beam Illumination Position on the x-axis. It also shows the reduction in the amplitude of the undesired subsidiary peaks (P1 and P3 not expressly denoted in FIG. 11) relative to the central peak P, which is shown in FIG. 8 as "P2". The alignment marks 6 disclosed are generally square in shape (see FIG. 9), as opposed to the rectangular shaped alignment marks disclosed in Angeley. The direction of polarization is such that the electric field of the radiation is in a direction perpendicular to the direction of the array of alignment marks, and parallel to the direction of the scan of the light beam across the semiconductor wafer.

There is a need for an alignment system which can utilize the advantages of the presently used alignment systems, but which provides an increased amount of desired light scattered and diffracted from alignment marks of a first set of such marks, while simultaneously decreasing the amount of undesired light scattered and diffracted from a second set of such marks.

SUMMARY OF THE INVENTION

The present invention is directed to an alignment system which uses polarized light with dark-field detection to detect light scattered and diffracted from alignment marks on a semiconductor wafer. It has been found that if the light passing through the apertures 31, 33 in the alignment reticle 32 of FIG. 3 is polarized such that the electric field of the radiation is parallel to the major axis of the alignment marks 34 and 34', respectively, then the desired response, i.e., the amount of light which passed through aperture 31 and scattered or diffracted from the alignment mark 34, is increased, and the undesired response, the amount of light which passed through aperture 31 and scattered or diffracted from alignment mark 34', is decreased.

The inventors have further conceived inventive methods of adapting existing apparatus to generate polarized light beams and polarization sensitive optical detectors. A first method in accordance with the present invention employs a modification of the reticle 32 of FIG. 3 of the Angeley patent such that light of differing polarization is transmitted through different transmissive regions of the reticle, and a modification of the detector mask of FIG. 5 of Angeley such that only light of a given polarization is transmitted through a specific transmissive region of the detector mask. A second method in accordance with the present invention interposes a rotating polarizing filter in the light path of the alignment system so that the polarization of the light illuminating the alignment marks rotates in a cyclical fashion. Additionally, the detector systems are modified so that they are responsive to the phase of the amplitude variations in the detected signal in response to the varying angle of polarization introduced by the rotating polarizing filter. Elements of these first and second methods may be combined to form additional inventive methods of generating the required polarized light beams and polarization sensitive optical detectors.

Viewed from a first aspect, the present invention is directed to apparatus for aligning features on a mask with features on a semiconductor wafer. The apparatus comprises a reticle which defines an aperture therethrough, an array of detectors which detect light diffracted from the marks on the semiconductor wafer, polarizing films covering the aperture, and a polarizing film located adjacent to the detector elements. The aperture in the reticle defines a pattern of light which illuminates marks on a semiconductor wafer. The polarizing films covering the aperture polarize the light transmitted through various portions of the aperture such that the electric field of the electromagnetic radiation is parallel to a major dimension of said portion of the aperture. The detector elements detect diffracted light such that a given detector is sensitive only to radiation of the desired polarization.

Viewed from a second aspect, the present invention is directed to apparatus for aligning features on a mask with features on a semiconductor wafer. The apparatus comprises a reticle defining an aperture therethrough, an array of detectors which detect light diffracted from the marks on the semiconductor wafer, a polarizing filter located in the path of the incident illuminating light, and a phase-locked circuit. The aperture in the reticle defines a pattern of light which illuminates marks on a semiconductor wafer. The filter is adapted to be rotated such that the direction of polarization of the light transmitted through the aperture rotates in a cyclical manner. The phase-locked circuit is locked to the rotating polarization of the incident light such that a given detector is sensitive only when the incident light is of a desired polarization.

Viewed from a third aspect, the present invention is directed to apparatus comprising a reticle defining an aperture therethrough, an array of detectors which detect light diffracted from the marks on the semiconductor wafer, a polarizing filter located in the path of the incident illuminating light, and a polarizing film. The aperture in the recticle defines a pattern of light which illuminates marks on a semiconductor wafer. The filter is adapted to be rotated such that the direction of polarization of the light transmitted through the aperture rotates in a cyclical manner. The polarizing film is located adjacent to the detector elements which detect diffracted light such that a given detector is sensitive only to radiation of a desired polarization.

Viewed from a fourth aspect, the present invention is directed to a method for increasing a desired observable signal in a dark-field based pattern recognition system which utilizes essentially rectangular marks. The method comprises the steps of illuminating said rectangular marks with electromagnetic radiation having a selected polarization which results in the electric field of the radiation being parallel to the length of the rectangular mark; and observing the radiation diffracted from the rectangular marks using a dark-field optical system. The electric field of the polarized radiation may also be at an angle with respect to the length of the rectangular mark, where the angle is chosen so as to result in the largest obtainable value of the desired observed signal.

Viewed from a fifth aspect, the present invention is directed to a method for increasing a desired observable signal while decreasing an undesirable observable background signal in a dark-field based pattern recognition system which utilizes first and second sets of essentially rectangular marks with the direction of the length of the essentially rectangular marks of the said two sets of marks perpendicular to one another. The method comprises the steps of illuminating said two sets of essentially rectangular marks with electromagnetic radiation having a polarization which results in the electric field of the radiation being parallel to the length of the essentially rectangular marks of the first set of marks so as to cause a desired observable signal diffracted from the first set of marks whose length is parallel to the electric field of the illuminating radiation to be increased, and to cause the undesired observable signal diffracted from the second set of marks whose length is perpendicular to the electric field of the illuminating radiation to be decreased; and observing the radiation diffracted from the rectangular marks using a dark-field optical system. The electric field of the polarized radiation may also be at an angle with respect to the length of the essentially rectangular marks of the first set of marks, where the angle is chosen so as to result in the largest obtainable value for the ratio of the desired observed signal to the undesired observable signal.

Viewed from a sixth aspect, the present invention is directed to a method for increasing an observable signal while decreasing an undesirable background signal in a dark-field based mask-to-semiconductor-wafer alignment and exposure system which utilizes first and second sets of essentially rectangular marks formed on the semiconductor wafer, with the direction of the length of the essentially rectangular marks of the said two sets of marks being perpendicular to one another. The method comprises the steps of illuminating said two sets of essentially rectangular marks with electromagnetic radiation having a polarization which results in the electric field of the radiation being parallel to the length of the essentially rectangular marks of the first set of marks so as to cause the desired observable signal diffracted from the first set of marks whose length is parallel to the electric field of the illuminating radiation to be increased, and to cause the undesired observable signal diffracted from the second set of marks whose length is perpendicular to the electric field of the illuminating radiation to be decreased; observing the radiation diffracted from the rectangular marks using a dark-field optical system and using this radiation to determine the alignment of the semiconductor wafer with respect to the alignment and exposure system; adjusting the position of the semiconductor wafer with respect to the alignment and exposure system so as to align the semiconductor with a mask which has been previously aligned with the alignment and exposure system; and using the alignment and exposure system to project and expose a pattern formed on the mask onto photosensitive material on the semiconductor wafer such that the pattern on the mask is essentially aligned with features which have previously been formed on the semiconductor wafer. The electric field of the polarized radiation may also be at an angle with respect to the length of the essentially rectangular marks of the first set of marks, where the angle is chosen so as to result in the largest obtainable value for the ratio of the desired observed signal to the undesired observable signal.

The present invention will be better understood from the following more detailed description taken with the accompanying drawings and claims.

DETAILED DESCRIPTION

Figure 1:
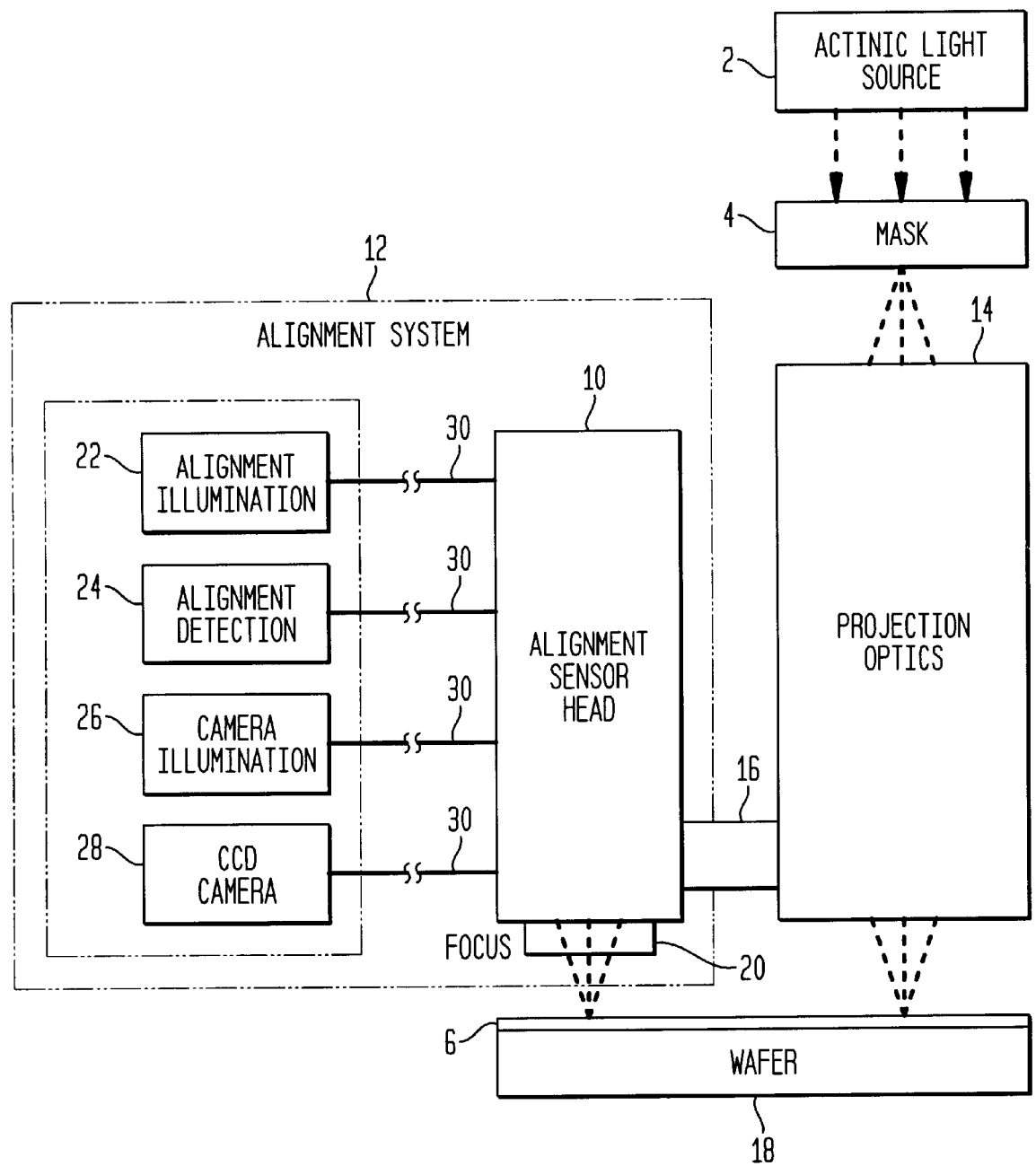
FIGS. 1, 2, 3, 4, 5, and 6 show Prior Art from U.S. Pat. No. 5,477,057 (Angeley et al.) and correspond to FIGS. 1, 2, 3, 4, 5 and 7, respectively, of same.
Figure 2:
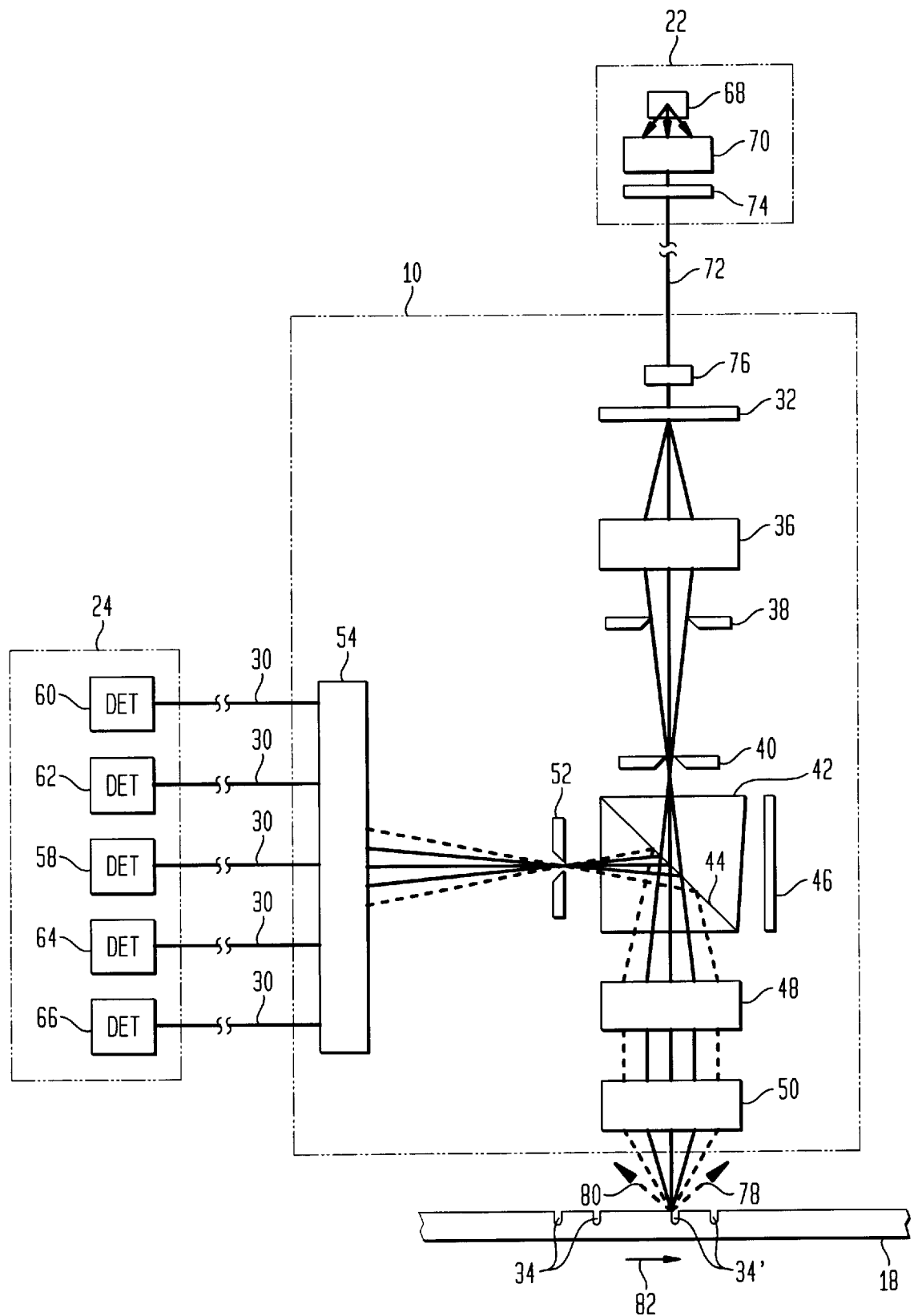
Figure 12:
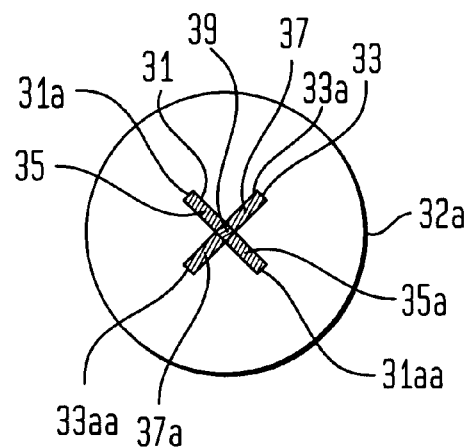
FIG. 12 shows a modified reticle in accordance with the present invention.

FIG. 12 shows a reticle 32a in accordance with the present invention. Reticle 32a, which is to be substituted for reticle 32 of FIG. 2, is useful to illuminate the patterns of alignment marks 34 and 34' of FIG. 2 with polarized light. Overlapping rectangular openings 31 and 33 are defined by reticle 32a. Opening 31 comprises portions 31a and 31aa; and opening 33 comprises portions 33a and 33aa. A central portion of the openings 31 and 33 in reticle 32a is covered with opaque material 39 which prevents the transmission of light through this central portion. The two remaining portions 33a and 33aa of the rectangular opening 33 are covered with polarizing filters 37 and 37a, respectively, oriented such that the electric field of the light passing through the filters 37 and 37a is parallel to the major edges of the openings 33a and 33aa. Similarly the two remaining portions 31a and 31aa of the rectangular opening 31 are covered with polarizing filters 35 and 35a, respectively, oriented such that the electric field of the light passing through the filters 35 and 35a is parallel to the major edges of the openings 31a and 31aa.

Figure 13:
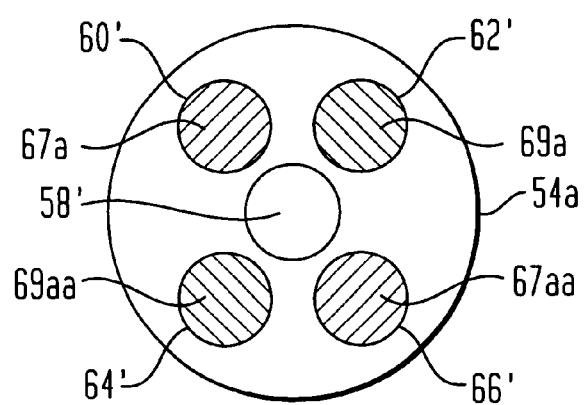
FIG. 13 shows a modified detector mask in accordance with the present invention.

FIG. 13 shows a detector mask 54a in accordance with the present invention. Detector mask 54a, which is to be substituted for detector mask 54 of FIG. 2, is useful to insure that only light of a particular polarization is transmitted on to the detectors 60, 62, 64, and 66. Openings 60' and 66' in the detector mask 54a are covered with polarizing filters 67a and 67aa, respectively. Filters 67a and 67aa are oriented such that only polarized light transmitted through openings 33a and 33aa in the reticle 32a will be transmitted on to the detectors 60 and 66. Similarly, openings 62' and 64' in the detector mask 54a are covered with polarizing filters 69a and 69aa. Filters 69a and 69aa are oriented such that only polarized light transmitted through openings 31a and 31aa in the reticle 32a will be transmitted on to the detectors 62 and 64.

Figure 3:
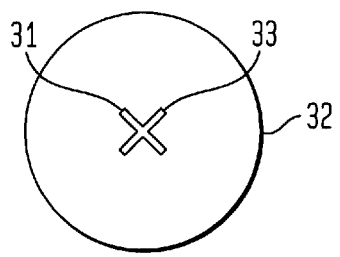
Figure 4:
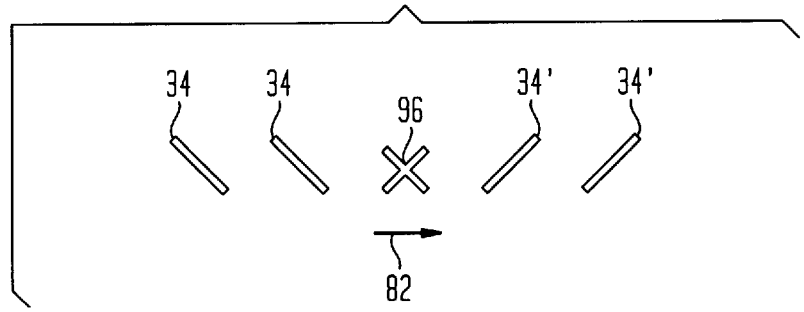
Figure 5:
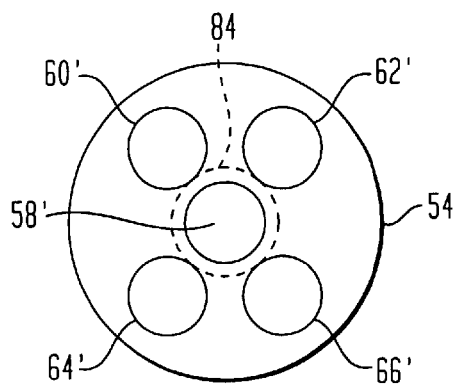
Figure 6:
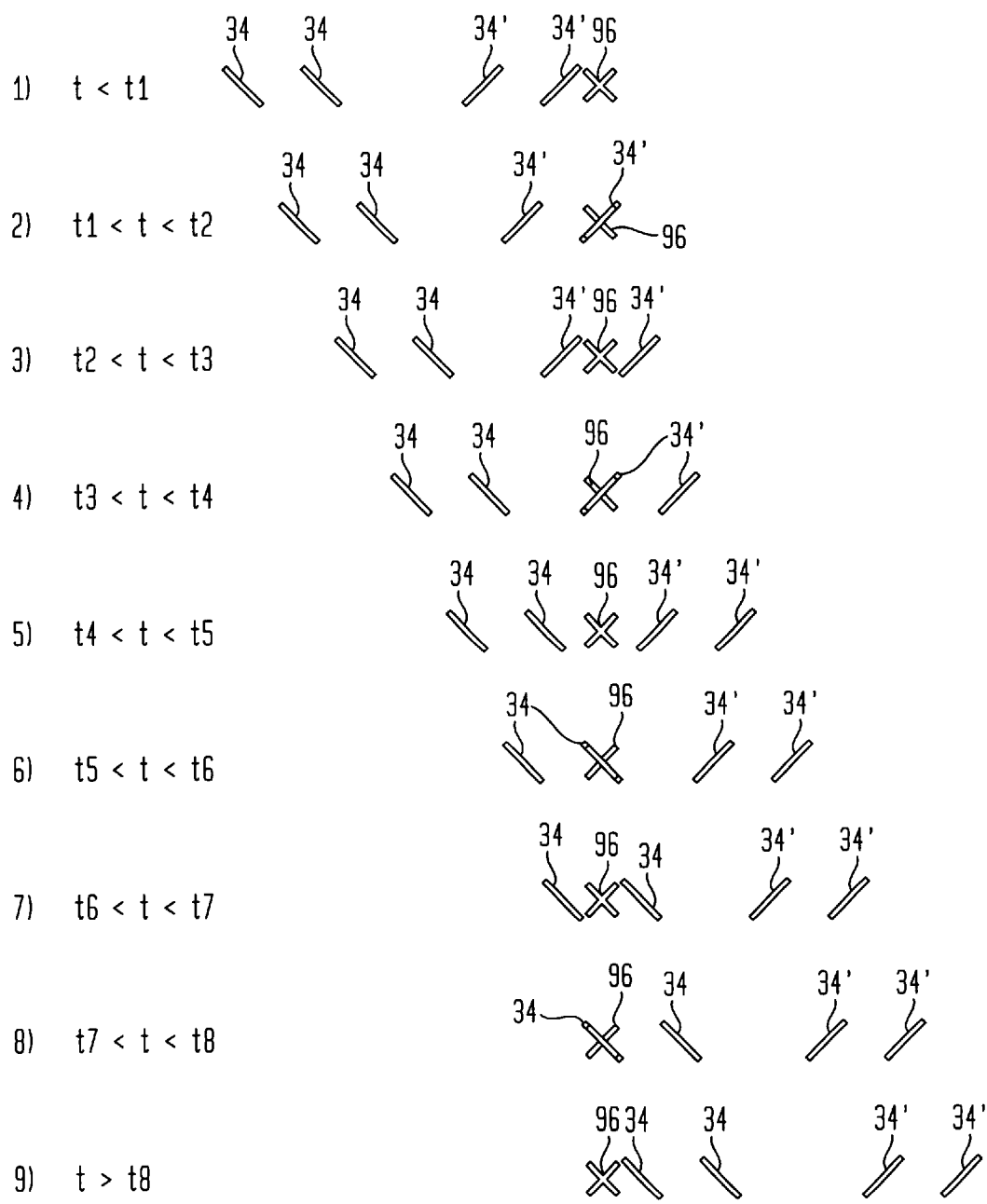
Figure 7:
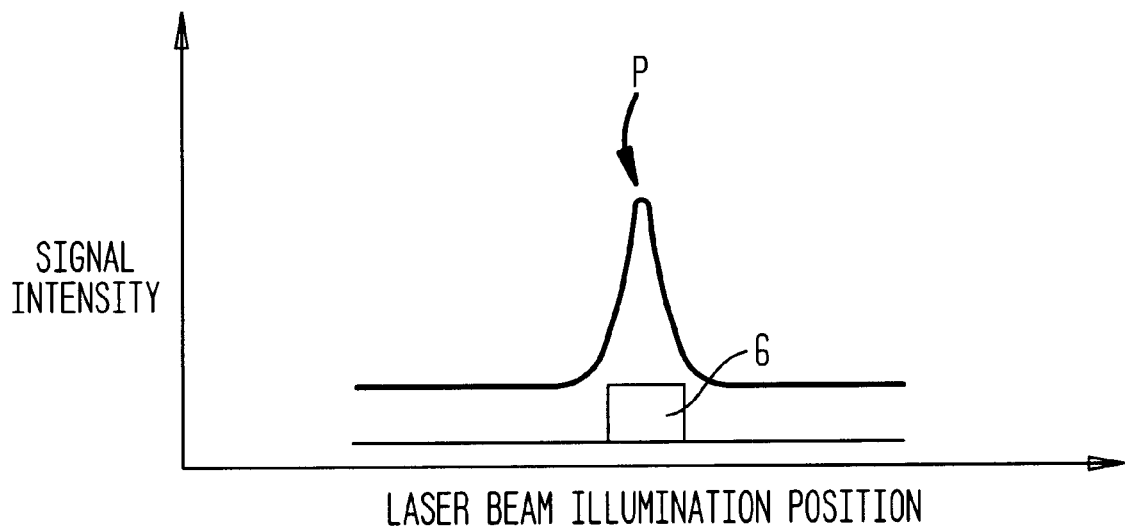
FIGS. 7, 8, 9, 10, and 11 show Prior Art from U.S. Pat. No. 5,285,258 (K. Kamon) and correspond to FIGS. 4, 5, 9A, 7A, and 7B, respectively, of same.
Figure 8:
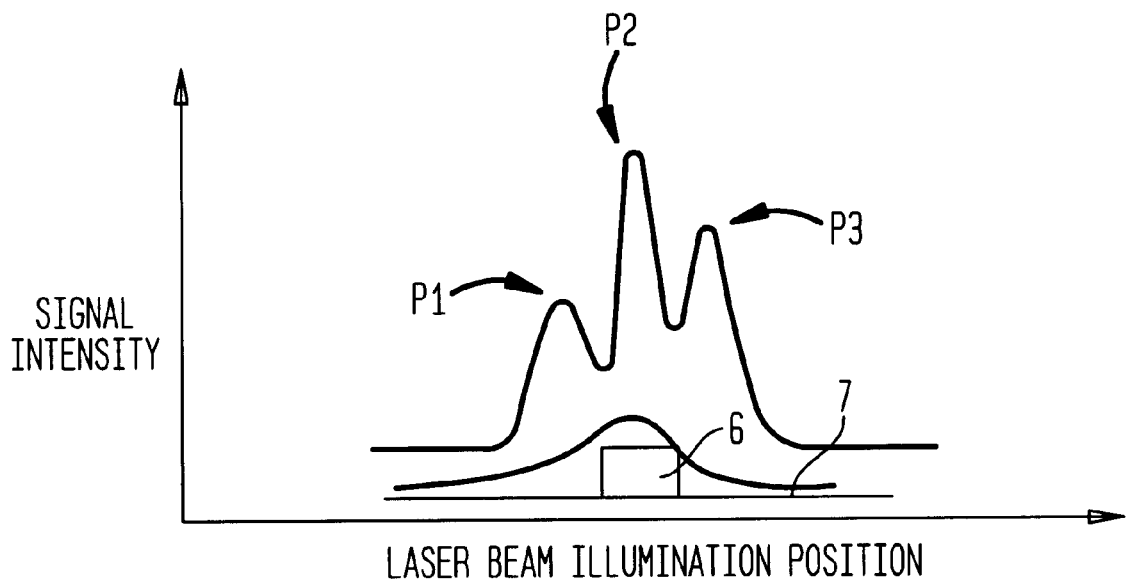
Figure 9:
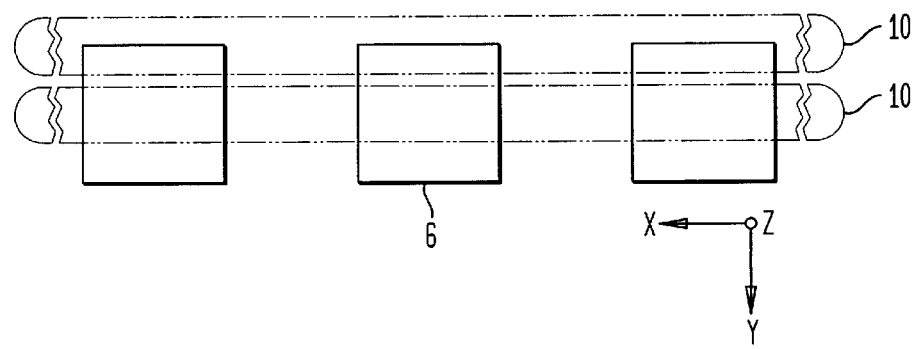
Figure 10:
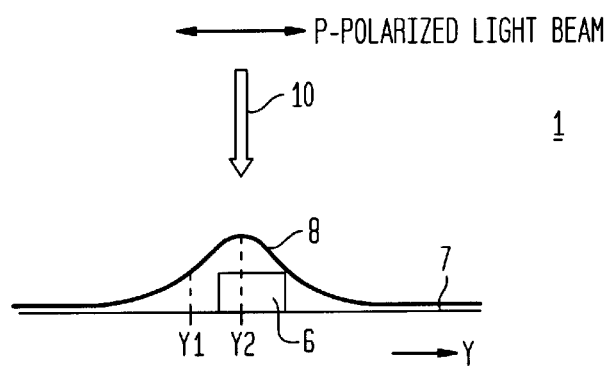
Figure 11:
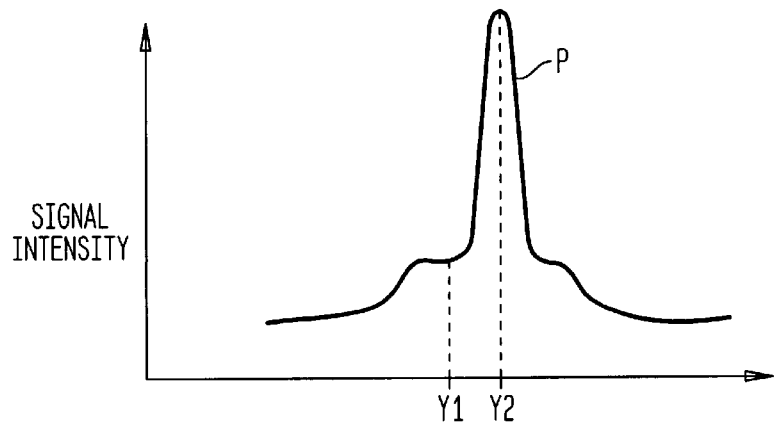

The substitution of reticle 32a of FIG. 12 for reticle 32 of FIGS. 2 and 3, and of detector mask 54a of FIG. 13 for detector mask 54 of FIGS. 2 and 5, is in accordance with a first embodiment of the present invention.

The advantages of modifying the apparatus of FIG. 2 such that the alignment marks 34 and 34' are illuminated with light patterns consisting of portions with different polarization, and modifying the apparatus so that individual detectors are sensitive to light of only a given polarization are discussed herein below.

Figure 14:
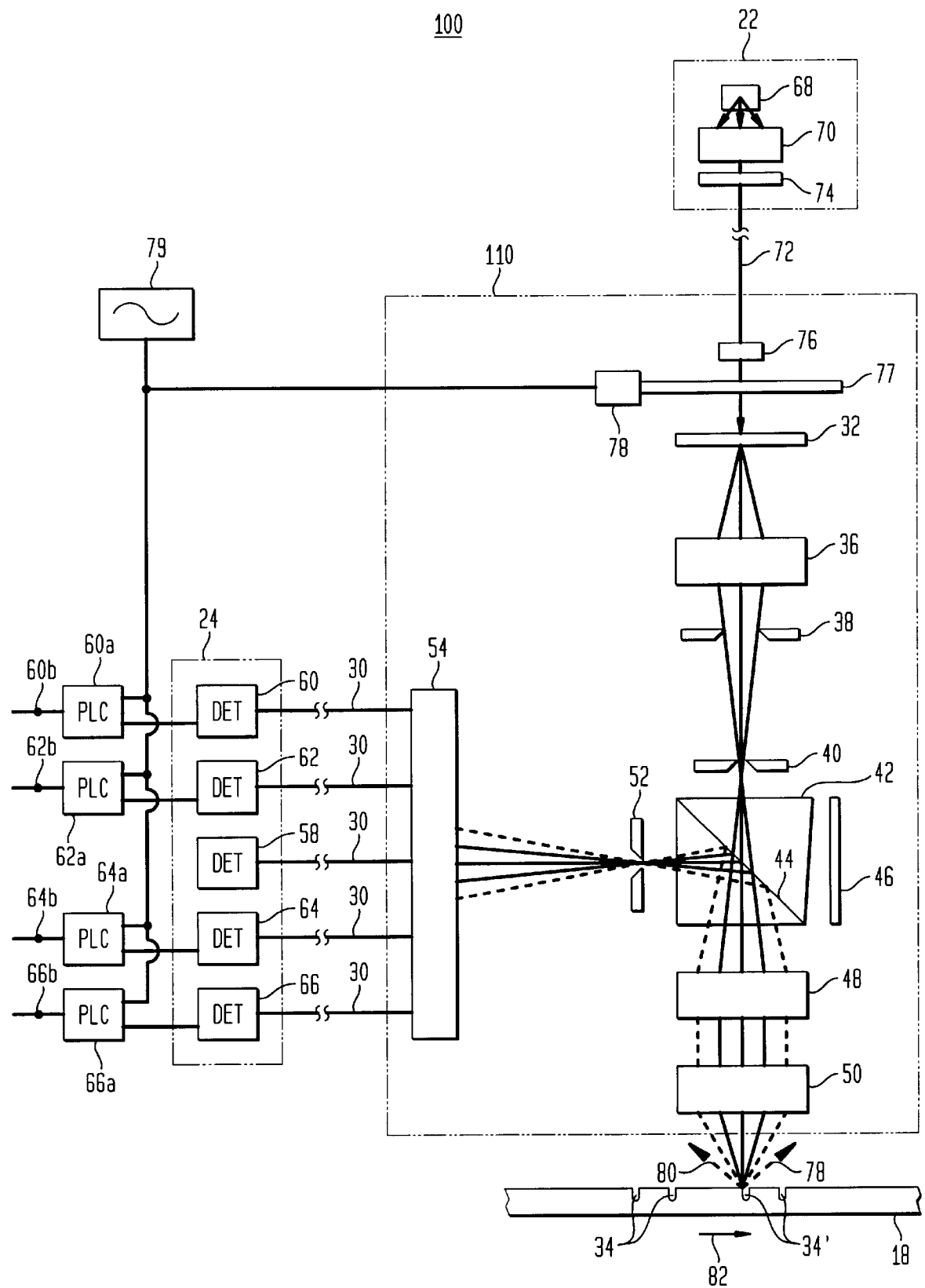
FIG. 14 shows a first modified alignment system in accordance with the present invention.

FIG. 14 shows an alignment system 100 using polarized light in accordance with a second embodiment of the present invention. The system 100 is similar to the prior art system of FIG. 2 which uses non-polarized light, and components which are the same or are very similar have common reference numbers. In system 100, a polarizing filter 77 is interposed between diffusing glass 76 and reticle 32 of the prior art optical system 10 of FIG. 2 to form an optical system 110 (shown within a dashed rectangle). Accordingly, system 100 uses polarized light. Rotating apparatus 78, which is controlled by signal from a source 79 (shown within a rectangle), is provided to rotate the polarizing filter 77 around an axis parallel to the optical axis of optical system 110 formed by optical components 32, 36, 38, 40, 48, and 50. The light passing through this optical system 110 and incident upon the alignment marks 34 and 34' on semiconductor wafer 18 is linearly polarized, with the direction of polarization in the plane perpendicular to the optical axis rotating in a cyclical manner. At one point in time, the electric field will be parallel to the major axis of opening 31 in reticle 32. A period of time later the electric field will be parallel to the major axis of opening 33 in reticle 32.

The electrical signals generated by detectors 60, 62, 64, and 66, in response to the light scattered or diffracted from the alignment marks 34 and 34', are detected using phase-locked circuits (PLCs) 60a, 62a, 64a, and 66a synchronized with the cyclical frequency of rotation of the polarizing filter 77 by the signal 79. The phase-locked circuits 60a, 62a, 64a, and 66a can be adjusted so that the output of each, e.g., output 60b of PLC 60a, is responsive only to light of a given polarization passing through the alignment optical system 110. The phase locked circuits 60a, 62a, 64a, and 66a can be adjusted to be sensitive to light which is polarized such that the electric field of the light is parallel to a major axis of the alignment marks 34 or 34', or the phase locked circuits 60a, 62a, 64a, and 66a can be adjusted to be sensitive to light which is polarized in a direction which results in the largest obtainable value of the desired observable signal, or in the largest obtainable value for the ratio of the desired observable signal to the undesired observable signal.

Figure 15:
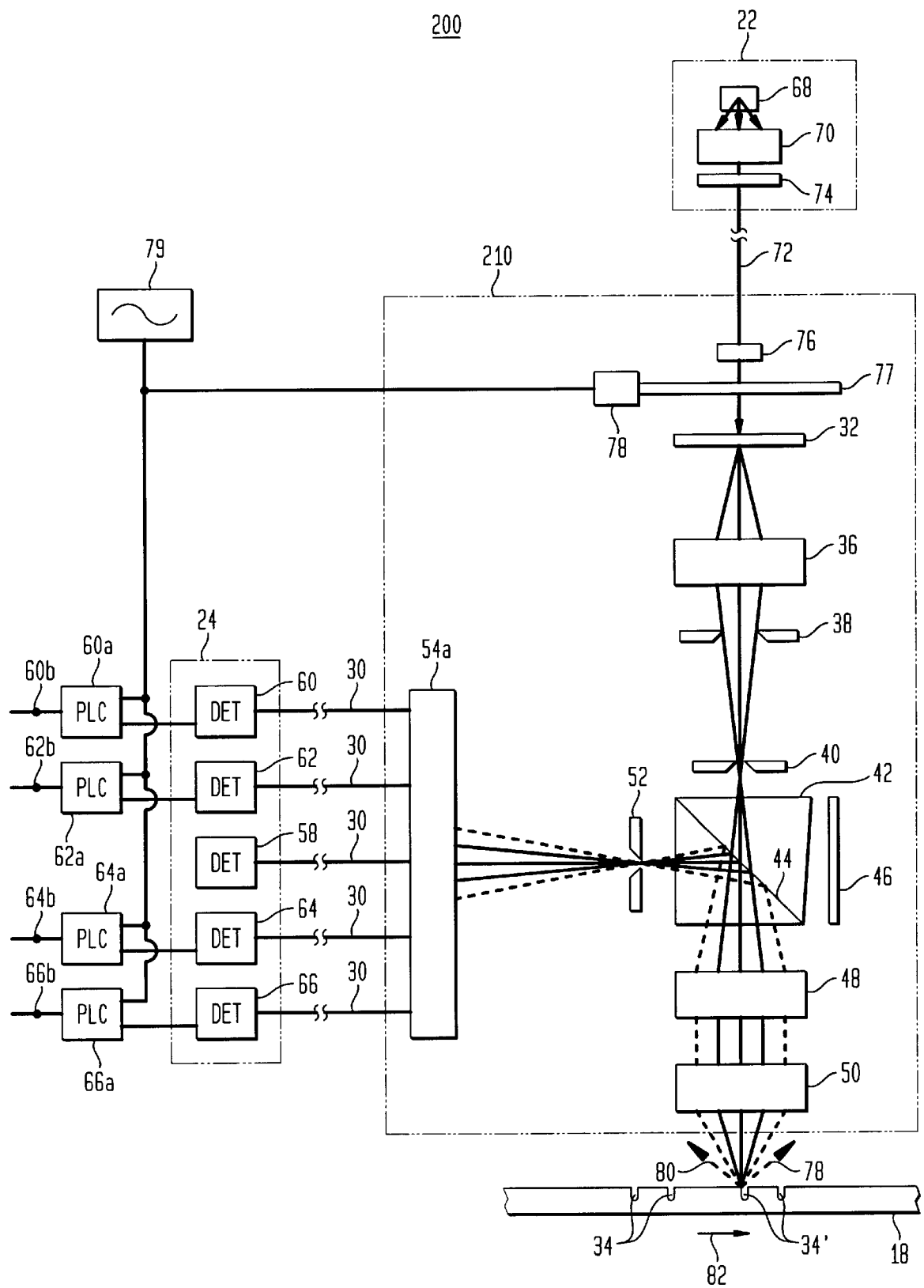
FIG. 15 shows a second modified alignment system in accordance with the present invention.

FIG. 15 shows an alignment system 200 using polarized light in accordance with a third embodiment of the present invention. The system 200 is similar to the prior art system of FIG. 2 which uses non-polarized light, and components which are the same or are very similar have common reference numbers. In system 200, a polarizing filter 77 is interposed between diffusing glass 76 and reticle 32 of the prior art optical system 10 of FIG. 2 to form an optical system 210 (shown within a dashed rectangle. Accordingly, system 200 uses polarized light. Rotating apparatus 78, which is controlled by a signal from a signal source 79 (shown within a rectangle), is provided to rotate the polarizing filter 77 around an axis parallel to the optical axis of an optical system 210 formed by optical components 32, 36, 38, 40, 48, and 50. The light passing through this optical system 210 and incident upon the alignment marks 34 and 34' on semiconductor wafer 18 is linearly polarized, with direction of polarization in the plane perpendicular to the optical axis rotating in a cyclical manner. At one point in time, the electric field will be parallel to the major axis of opening 31 in reticle 32. A period of time later the electric field will be parallel to the major axis of opening 33 in reticle 32.

FIG. 15 shows the detector mask 54a of FIG. 13 which is used with system 200. One difference between system 100 of FIG. 14 and system 200 of FIG. 15 is that detector mask 54a of FIG. 13 is substituted for detector mask 54 of FIG. 14. Detector mask 54a is useful to insure that only light of a particular polarization is transmitted on to the detectors 60, 62, 64, and 66. The polarizing filters 67a, 67aa, 69a, and 69aa in detector mask 54a can be adjusted so that detectors 60, 62, 64, and 66 are sensitive to light which is polarized such that the electric field of the light is parallel to a major axis of the alignment marks 34 or 34', or the polarizing filters 67a, 67aa, 69a, and 69aa in detector mask 54a can be adjusted so that detectors 60, 62, 64, and 66 are sensitive to light which is polarized in a direction which results in the largest obtainable value of the desired observable signal, or in the largest obtainable value for the ratio of the desired observable signal to the undesired observable signal. Phase-locked circuits 60a, 62a, 64a and 66a are shown in system 200 but same are optional and can be deleted with the outputs of detectors 60, 62, 64, and 66 being used instead of the outputs of PLCs 60a, 62a, 64a, and 66a.

Figure 16:
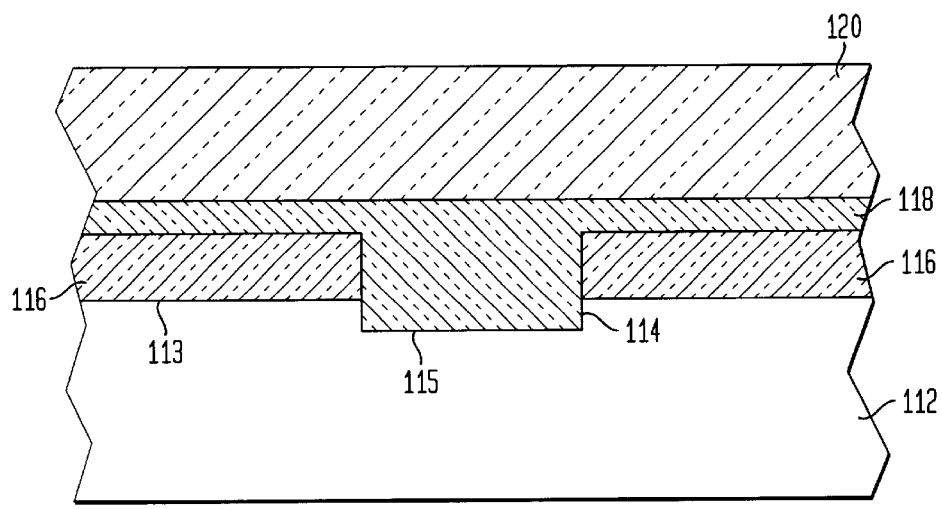
FIG. 16 shows a sectional view of an alignment mark.

FIG. 16 shows a cross-sectional view of a semiconductor wafer 112 on a surface 113 of which has been formed a layer of silicon nitride 116. A recessed alignment feature 114 with a bottom surface 115, has been formed in the layer of silicon nitride 116, extending through the layer of silicon nitride 116 into the semiconductor wafer 112. A planarized anti-reflection layer 118 (ARC) and a layer of photoresist 120 have been formed on the surface of the semiconductor wafer 112. The semiconductor wafer 112 is of silicon of the type and configuration used in the manufacture of semiconductor devices. The recessed alignment feature 114 is fabricated using techniques which would be useful in the manufacture of semiconductor dynamic random access memory devices (DRAMs). Feature 114 typically has a depth, defined as the distance from the surface 113 of the semiconductor wafer to the bottom 115 of the alignment feature 114, in the range of 0 to 100 nm. The silicon nitride dielectric layer 116 is of a type and thickness which would typically be used in the manufacture of such DRAMs. It would typically have a thickness in the range of 50 to 250 nm. The planarized ARC 118 is commonly used in semiconductor VLSI manufacturing. It is coated with a typical thickness in the range of 20 to 150 nm. The imaging photoresist layer 120 would typically have thickness in the range of 300 to 1500 nm.

The response of the detectors in an alignment system of the type described in the referenced U.S. Pat. No. 5,477,057 has been simulated using existing programs for simulating three dimensional solutions of electromagnetic problems in photolithography. The semiconductor wafer 112 illustrated in FIG. 16 was used as the carrier of the alignment marks, and the problem was simulated with both polarized and non-polarized light used to illuminate the alignment marks. Solutions were found over a range of both the trench depth and the thickness of the silicon nitride films.

These simulations suggest that the use of polarized light in this type of alignment system can result in an increase in the observed desired signal scattered or diffracted by a first set of alignment marks (alignment marks 34, for example), compared to the observed desired signal when non-polarized light is used. The increase in observed signal can be as much as 25% or more. The simulations also suggest that the use of polarized light in this type of alignment system can result in a decrease in the undesired background signal scattered or diffracted from the second set of alignment marks (alignment marks 34' in this example). Such an increase in desired signal and decrease in undesired signal will result in improved performance of the alignment system when used with a given set of alignment marks formed in or on a particular semiconductor wafer.

Figure 17:
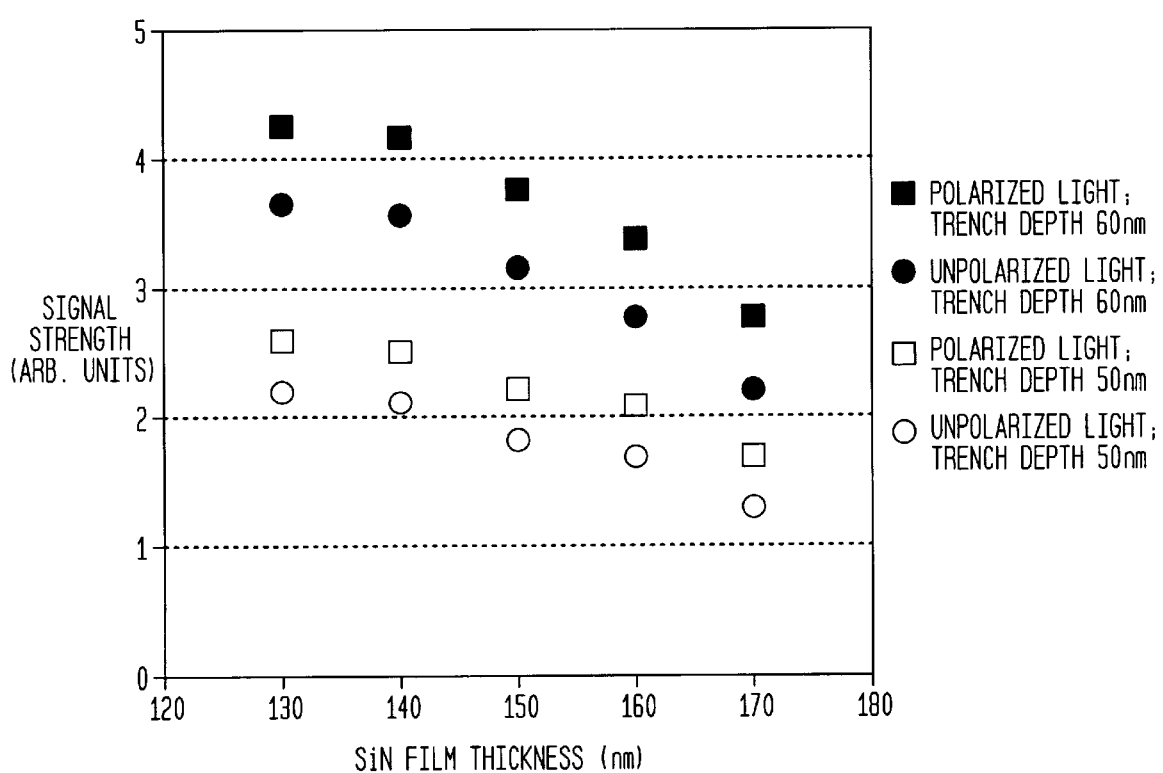
FIG. 17 graphically shows the simulated response of an alignment system using polarized and non-polarized light.

FIG. 17 graphically illustrates an improvement in performance of the present invention versus prior art systems. On the x-axis is plotted the thickness, in nm, of the silicon nitride film 116 overlying the trench 114 on the semiconductor substrate illustrated in FIG. 16. On the y-axis is plotted the simulated response, in arbitrary units, of the detector system. The simulated response of the detector system is plotted for two depths of the trench 114, 50 nm and 60 nm. For each depth, two responses are shown, one for the inventive alignment system using polarized light, indicated by squares, and one for the simulated response of the prior art alignment system using non-polarized light, indicated by circles. The simulated data illustrate an increase of approximately 25% in the desired signal when polarized light is used rather than non-polarized light.

It is to be understood that the particular structures and processes described are merely illustrative of the general principles of the invention. Various modifications are possible without departing from the spirit and principles of the invention. For example, various types of polarizing filters may be used to polarize the light illuminating the alignment marks. Further, various methods may be employed for rotating the polarization of the illuminating light beam, including both mechanical means and electrical or electro-optic means. Further, the direction of polarization may be selected to adjust various parameters of the system, such as values of desired signals, values of undesired signals, or values of ratios of various signals. Still further, various methods may be employed for modifying the response of the detectors so that they are sensitive only to light of a given polarization. Furthermore, the concepts described herein may be applied to other types of systems and applications where it is desirable to increase the amount of electromagnetic radiation scattered or diffracted from a particular mark or inscription, or to increase the response of the system to desired responses relative to undesired responses.

What is claimed is:

1. Apparatus comprising:
   a reticle defining an aperture therethrough, said aperture defining a pattern of light which illuminates marks on a semiconductor wafer;
   an array of detectors which detect light diffracted from the marks on the semiconductor wafer;
   polarizing films covering the aperture which polarize the light transmitted through various portions of the aperture such that the electric field of the electromagnetic radiation is parallel to a major dimension of said portion of the aperture; and
   a polarizing film located adjacent to the detector elements which detect diffracted light such that a given detector is sensitive only to radiation of the desired polarization.

2. Apparatus comprising:
   a reticle defining an aperture therethrough, said aperture defining a pattern of light which illuminates marks on a semiconductor wafer;
   an array of detectors which detect light diffracted from the marks on the semiconductor wafer;
   a polarizing filter located in the path of the incident illuminating light, said filter being adapted to be rotated such that the direction of polarization of the light transmitted through the aperture rotates in a cyclical manner; and
   a phase-locked circuit locked to the rotating polarization of the incident light such that a given detector is sensitive only when the incident light is of a desired polarization.

3. Apparatus comprising:
   a reticle defining an aperture therethrough, said aperture defining a pattern of light which illuminates marks on a semiconductor wafer;
   an array of detectors which detect light diffracted from the marks on the semiconductor wafer;
   a polarizing filter located in the path of the incident illuminating light, said filter being adapted to be rotated such that the direction of polarization of the light transmitted through the aperture rotates in a cyclical manner; and
   a polarizing film located adjacent to the detector elements which detect diffracted light such that a given detector is sensitive only to radiation of a desired polarization.

4. The apparatus of claim 3 further comprising a phase-locked circuit locked to the rotating polarization of the incident light.

5. A method for increasing a desirable observable signal in a dark-field based pattern recognition system which utilizes essentially rectangular marks, said method comprising the steps of:
   illuminating said rectangular marks with electromagnetic radiation having a selected polarization which results in the electric field of the radiation being parallel to the length of the rectangular mark; and
   observing the radiation diffracted from the rectangular marks using a dark-field optical system.

6. The method of claim 5 wherein the electric field of the polarized radiation is at an angle with respect to the length of the rectangular mark, said angle being chosen so as to result in a large desired observable signal.

7. The method of claim 5 wherein the width of the rectangular mark is comparable to or smaller than the wavelength of the illuminating radiation.

8. The method of claim 5 wherein the marks have arbitrary elongated shapes with one dimension greater than a dimension perpendicular to said greater dimension, and the polarization of the illuminating radiation is such that the electric field is parallel to the greater dimension of the marks.

9. The method of claim 5 wherein the pattern recognition system is used to determine the alignment of a patterned mask relative to a set of marks formed upon a semiconductor wafer.

10. A method for increasing a desired observable signal while decreasing an undesirable observable background signal in a dark-field based pattern recognition system which utilizes first and second sets of essentially rectangular marks with the direction of the length of the essentially rectangular marks of the said two sets of marks perpendicular to one another, said method comprising the steps of:

illuminating said two sets of essentially rectangular marks with electromagnetic radiation having a polarization which results in the electric field of the radiation being parallel to the length of the essentially rectangular marks of the first set of marks so as to cause a desired observable signal diffracted from the first set of marks whose length is parallel to the electric field of the illuminating radiation to be increased, and to cause the undesired observable signal diffracted from the second set of marks whose length is perpendicular to the electric field of the illuminating radiation to be decreased; and observing the radiation diffracted from the rectangular marks using a dark-field optical system.

11. The method of claim 10 wherein the electric field of the polarized radiation is at an angle with respect to the length of the essentially rectangular marks of the first set of marks, said angle being chosen so as to result in a large value for the ratio of desired observable signal to the undesired observable signal.

12. A method for increasing an observable signal while decreasing an undesirable background signal in a dark-field based mask-to-semiconductor-wafer alignment and exposure system which utilizes first and second sets of essentially rectangular marks formed on the semiconductor wafer, with the direction of the length of the essentially rectangular marks of the said two sets of marks being perpendicular to one another, said method comprising the steps of:

illuminating said two sets of essentially rectangular marks with electromagnetic radiation having a polarization which results in the electric field of the radiation being parallel to the length of the essentially rectangular marks of the first set of marks so as to cause the desired observable signal diffracted from the first set of marks whose length is parallel to the electric field of the illuminating radiation to be increased, and to cause the undesired observable signal diffracted from the second set of marks whose length is perpendicular to the electric field of the illuminating radiation to be decreased;

observing the radiation diffracted from the rectangular marks using a dark-field optical system and using this radiation to determine the alignment of the semiconductor wafer with respect to the alignment and exposure system;

adjusting the position of the semiconductor wafer with respect to the alignment and exposure system so as to align the semiconductor with a mask which has been previously aligned with the alignment and exposure system; and using the alignment and exposure system to project and expose a pattern formed on the mask onto photosensitive material on the semiconductor wafer such that the pattern on the mask is essentially aligned with features which have previously been formed on the semiconductor wafer.

13. The method of claim 12 wherein the electric field of the polarized radiation is at an angle with respect to the length of the essentially rectangular marks of the first set of marks, said angle being chosen so as to result in a large value for the ratio of desired observable signal to the undesired observable signal.

* * * * *